(12) United States Patent
Bower et al.

(10) Patent No.: US 10,283,655 B2
(45) Date of Patent: May 7, 2019

(54) QUANTUM DOT APPARATUS AND ASSOCIATED METHODS AND APPARATUS

(71) Applicant: EMBERION OY, Espoo (FI)

(72) Inventors: Chris Bower, Ely (GB); Elisabetta Spigone, Cambridge (GB)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 15/549,252

(22) PCT Filed: Jan. 28, 2016

(86) PCT No.: PCT/FI2016/050044
§ 371 (c)(1),
(2) Date: Aug. 7, 2017

(87) PCT Pub. No.: WO2016/124814
PCT Pub. Date: Aug. 11, 2016

(65) Prior Publication Data
US 2018/0040750 A1    Feb. 8, 2018

(30) Foreign Application Priority Data
Feb. 6, 2015   (EP) ................... 15154230

(51) Int. Cl.
*H01L 31/0352* (2006.01)
*C09D 11/52* (2014.01)
(Continued)

(52) U.S. Cl.
CPC ..... *H01L 31/035218* (2013.01); *B41J 2/2114* (2013.01); *B82Y 15/00* (2013.01); *C09D 11/322* (2013.01); *C09D 11/52* (2013.01); *B82Y 20/00* (2013.01); *H01L 51/0005* (2013.01); *H01L 51/0015* (2013.01)

(58) Field of Classification Search
CPC .............. H01L 51/0005; H01L 51/0015; B41J 2/2114; C09D 11/322
See application file for complete search history.

(56) References Cited

FOREIGN PATENT DOCUMENTS

| | | |
|---|---|---|
| EP | 2 774 764 A1 | 9/2014 |
| WO | WO 2007/138298 A1 | 12/2007 |

OTHER PUBLICATIONS

International Search Report & Written Opinion dated Apr. 29, 2016 corresponding to International Patent Application No. PCT/FI2016/050044.
(Continued)

*Primary Examiner* — Mounir S Amer
(74) *Attorney, Agent, or Firm* — Squire Patton Boggs (US) LLP

(57) ABSTRACT

A method comprising: depositing a quantum dot solution onto a supporting substrate in a drop-wise manner to form one or more discrete droplets on a surface of the substrate, the quantum dot solution and discrete droplets comprising a plurality of quantum dots having primary ligands attached thereto to stabilize the quantum dots in solution; and depositing a ligand-exchange solution onto the one or more discrete droplets in a drop-wise manner to cause replacement of the primary ligands attached to the plurality of quantum dots with shorter-chain secondary ligands, replacement of the primary ligands with the secondary ligands allowing the plurality of quantum dots within each discrete droplet to become sufficiently close packed to facilitate charge transfer there between.

9 Claims, 11 Drawing Sheets

(51) Int. Cl.
*B82Y 15/00* (2011.01)
*C09D 11/322* (2014.01)
*B41J 2/21* (2006.01)
*H01L 51/00* (2006.01)
*B82Y 20/00* (2011.01)

(56) References Cited

OTHER PUBLICATIONS

European Search Report dated Aug. 4, 2015 corresponding to European Patent Application No. 15154230.5.
David H. Webber et al., "Ligand Exchange on Colloidal CdSe Nanocrystals Using Thermally Labile tert-Butylthiol for Improved Photocurrent in Nanocrystal Films," Journal of the American Chemical Society, vol. 134, No. 2, Jan. 18, 2012, pp. 1085-1092, XP55206115.

QUANTUM DOT APPARATUS AND ASSOCIATED METHODS AND APPARATUS

TECHNICAL FIELD

The present disclosure relates to the field of quantum dots (where a quantum dot encompasses a nanocrystal with optical properties resulting as a consequence of the finite size effects that occur in collections of a few 100 atoms or less, where the morphology of the nanocrystal can be spherical, rod-like, plate-like etc.), associated methods and apparatus, and in particular concerns a method of forming a quantum dot apparatus in which quantum dot and ligand-exchange solutions are deposited in a drop-wise manner to form one or more discrete droplets on the surface of a supporting substrate. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new optical sensors, some of which comprise quantum dots for greater design flexibility and improved optical efficiency.

The listing or discussion of a prior-published document or any background in this specification should not necessarily be taken as an acknowledgement that the document or background is part of the state of the art or is common general knowledge.

SUMMARY

According to a first aspect, there is provided a method comprising:
  depositing a quantum dot solution onto a supporting substrate in a drop-wise manner to form one or more discrete droplets on a surface of the substrate, the quantum dot solution and discrete droplets comprising a plurality of quantum dots having primary ligands attached thereto to stabilise the quantum dots in solution; and
  depositing a ligand-exchange solution onto the one or more discrete droplets in a drop-wise manner to cause replacement of the primary ligands attached to the plurality of quantum dots with shorter-chain secondary ligands, replacement of the primary ligands with the secondary ligands allowing the plurality of quantum dots within each discrete droplet to become sufficiently close packed to facilitate charge transfer there between.

The method may comprise:
  depositing a quantum dot solution onto a supporting substrate in a drop-wise manner to form two or more discrete droplets on a surface of the substrate, the quantum dot solution and discrete droplets comprising a plurality of quantum dots having primary ligands attached thereto to stabilise the quantum dots in solution; and
  depositing a ligand-exchange solution onto the two or more discrete droplets in a drop-wise manner to cause replacement of the primary ligands attached to the plurality of quantum dots with shorter-chain secondary ligands, replacement of the primary ligands with the secondary ligands allowing the plurality of quantum dots within each discrete droplet to become sufficiently close packed to facilitate charge transfer there between.

The term quantum dot encompasses a nanocrystal with optical properties resulting as a consequence of the finite size effects that occur in collections of a few 100 atoms or less, where the morphology of the nanocrystal can be spherical, rod-like, plate-like or other shape.

The quantum dot solution may be deposited such that the one or more discrete droplets have a diameter of no more than 5 µm, 10 µm, 25 µm, 50 µm or 100 µm. The diameter may range from a few microns to hundreds of microns.

The quantum dot solution may be deposited such that the one or more discrete droplets are spaced apart by no more than 1 µm, 5 µm, 10 µm or 15 µm. Typically, the spacing may be a few microns (up to around 10 µm).

The quantum dots may be spaced apart from one another by at least 1.5 nm, 2 nm, 2.5 nm or 5 nm before ligand replacement.

The quantum dots may be spaced apart from one another by no more than 0.25 nm, 0.5 nm, 0.75 nm, 1 nm or 1.25 nm after ligand replacement or removal.

The quantum dot solution may comprise organic aromatic solvents such as toluene, chlorobenzene, xylene, NMP or organic no aromatic solvents such as hexane, octane or other alkane. Aqueous solvents are also possible, the quantum dots may comprise PbS, PbSe, PbTe, CdS, CdSe, CdTe, InP, InAs, HgTe, ZnSe, CdSeTe, CdHgTe, ZnSeS, ZnHgSe, ZnSeTe or combinations of these materials.

The ligand-exchange solution may comprise acetonitrile.

The primary ligands may comprise one or more of thio-, amino-, carboxylic-, phosphonato-, sulfonate or alkyl or aromatic tail groups such as: oleic acid, oleate, trioctylphosphine oxide, alkylphosphonic acid, fatty acid and long-chain alkylamine.

The secondary ligands may comprise one or more of 1,2-ethanedithiol, methylamine, ethylamine, ethylene diamine, ethanethiol, propanethiol, 1,3-benzenedithiol, hydrazine, formic acid, oxalic acid, acetic acid, pyridine, butylamine, formamide, $SnS_4$, $PbBr_2$, $PbI_2$ and $PbCl_2$, $Na_2S \cdot 9H_2O$, KOH.

The method may comprise depositing a rinse solution onto the two or more droplets in a drop-wise manner to remove the primary ligands and any excess secondary ligands from the substrate.

The rinse solution may comprise one or more of acetonitrile and toluene.

Depositing one or more of the quantum dot, ligand-exchange and rinse solutions in a drop-wise manner may comprise depositing drops of no more than 1 ml, 1 µl, 1 µl or 1 fl in volume.

The method may comprise evaporating the rinse solution after deposition to aid removal of the primary and excess secondary ligands from the substrate.

The method may comprise controlling one or more of the temperature of the substrate, the surface chemistry of the substrate, and the composition of the rinse solution to facilitate evaporation of the rinse solution.

The method may comprise:
allowing the one or more discrete droplets to dry after deposition of the quantum dot and ligand-exchange solutions to form two or more corresponding quantum dot regions on the surface of the substrate; and
repeating the deposition and drying steps until the one or more quantum dot regions have a predetermined thickness.

The quantum dot solution and discrete droplets may further comprise an electrically conductive material, the quantum dots and electrically conductive material arranged within the quantum dot solution and discrete droplets to form a composite material.

The method may comprise depositing a functional material onto the one or more discrete droplets to functionalise the plurality of quantum dots within the droplets for a particular application or encapsulate the quantum dots to provide environmental stability.

The functional material may comprise one or more of a biological, metallic nanoparticle, semiconducting and photosensitive material.

The functional material may comprise one or more of an antibody, an antigen, a protein, a DNA fragment, a conjugated polymer and a dye.

The quantum dot solution may be deposited to form a one, two or three dimensional array of discrete droplets on the surface of the substrate. Combinations of the same or different quantum dot materials with the same size or different sizes can be printed in alternate layers to build more complex architectures.

According to a further aspect, there is provided an apparatus comprising one or more discrete quantum dot regions on a surface of a supporting substrate, wherein each quantum dot region comprises a plurality of quantum dots separated from one another by secondary ligands attached thereto, and wherein the secondary ligands have a chain length which is sufficiently short to facilitate charge transfer between the plurality of quantum dots within the quantum dot region.

The one or more discrete quantum dot regions may have a thickness of at least 10 nm, 100 nm, 1 μm, 10 μm or 100 μm.

The secondary ligands may have a chain length of no more than 0.1 nm, 0.25 nm, 0.5 nm, 0.75 nm, 1 nm or 1.25 nm.

The substrate may comprise an electrically conductive material configured to transfer charge from the quantum dots.

The substrate may be formed from or coated by the electrically conductive material.

The electrically conductive material may comprise one or more of carbon, graphene, reduced graphene oxide, carbon nanotubes, a metal and a semiconductor.

The apparatus may comprise first and second electrodes configured to enable a flow of electrical current from the first electrode through the electrically conductive material to the second electrode.

The plurality of quantum dots may comprise one or more of CdSe, CdS, PbSe, PbS, ZnO, ZnS, CZTS, $Cu_2S$, $Bi_2S_3$, $Ag_2S$, HgTe, CdSe, CdHgTe, InAs, InSb, PbTe, CdTe, InP, ZnSe, CdSeTe, ZnSeS, ZnHgSe, ZnSeTe Ge and CIS.

The substrate may comprise one or more of diamond like carbon (DLC), Si, GaAs, BN, $SiO_2$, LiF, $Al_2O_3$, $HfO_2$ and graphene.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a camera, an image sensor, a photodetector, a phototransistor, and a module for one or more of the same.

According to a further aspect, there is provided a deposition tool comprising first and second deposition heads each having a respective cartridge,
wherein the first deposition head is configured to deposit a quantum dot solution from its respective cartridge in a drop-wise manner, the quantum dot solution comprising a plurality of quantum dots having primary ligands attached thereto to stabilise the quantum dots in solution, and
wherein the second deposition head is configured to deposit a ligand-exchange solution from its respective cartridge in a drop-wise manner, the ligand-exchange solution configured to enable replacement of the primary ligands attached to the plurality of quantum dots with shorter-chain secondary ligands.

The first and second deposition heads may be configured to be moved independently of one another.

The first and second deposition heads may form constituent parts of a combined deposition head so as to be configured to be moved together.

The deposition tool may comprise a third deposition head having a respective cartridge, the third deposition head configured to deposit a rinse solution from its respective cartridge in a drop-wise manner, the rinse solution configured to enable removal of the primary ligands and any excess secondary ligands.

The deposition tool may comprise a plurality of the first and second deposition heads together with their respective cartridges.

The deposition tool may be one or more of an inkjet, spray, electrospray and valve-jet system.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 6a is a conductive AFM image of the quantum dot region of FIG. 5a;

DESCRIPTION OF SPECIFIC ASPECTS/EMBODIMENTS

Sensors currently exist for detecting a wide variety of different stimuli, including light, temperature and chemical or biological species. Many sensors are based on thin-film transistors which can be used as transducers to make sensitive measurements of the physical parameter. In these devices, the stimuli being sensed influence the flow of charge carriers through the transistor channel from a source electrode to a drain electrode, and the level of current flow provides an indication of the physical parameter.

The devices can be made sensitive to a specific stimuli by functionalization of the channel material, e.g. by using an optically sensitive material which responds to a particular wavelength of light, or a biological molecule which binds to a particular analyte. Quantum dots are suitable for use as optically sensitive materials because they have a narrow absorption wavelength that can be controlled by changing the size of the quantum dots, and exhibit a relatively high quantum efficiency. Quantum dots can also be fabricated from low cost, solution processed materials, can be manufactured at room temperature and can be easily integrated with existing CMOS and semiconductor devices, all of which facilitate large scale manufacture.

In device fabrication, quantum dots are typically deposited from solution onto a substrate to form a close-packed layer. The formation of a close-packed layer enables charge transfer between the dots for use in detection of the incident electromagnetic radiation. In order to passivate the reactive surface of the quantum dots and reduce their aggregation within the solution, the quantum dots must be stabilized with ligands. The ligands are generally long-chain (~2 nm) fatty acids such as oleic acid which make the quantum dots soluble in non-polar organic solvents such as toluene. These long-chain ligands can hinder the formation of a close-packed quantum dot layer and are therefore typically replaced by shorter-chain ligands having a chain length which is sufficiently short to enable charge transfer between the quantum dots.

The fabrication process usually involves several time-consuming processing steps. Once such method involves spin-coating the substrate sequentially with quantum dot, ligand-exchange and rinse solutions. A disadvantage of this technique, however, is that it is difficult to get the ligand-exchange solution to infiltrate and perform ligand replacement on quantum dots that are deep within the layer. This becomes even more of an issue for thicker layers of quantum dots (e.g. >100 nm), which are often desirable in applications such as X-ray detection to improve absorption of the incident electromagnetic radiation.

Current fabrication methods are therefore time consuming and limit the thickness of the quantum dot layers that can be deposited.

There will now be described an apparatus and associated methods that may or may not provide a solution to one or more of these issues.

Figure 1:
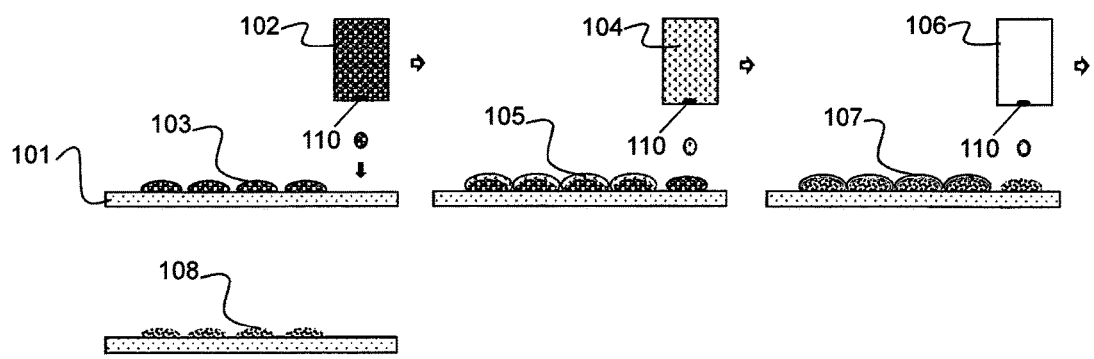
FIG. 1 illustrates schematically one example of a method of forming a quantum dot apparatus.

FIG. 1 illustrates schematically a method of forming a layer of quantum dots suitable for use in a sensor. The method comprises depositing (e.g. via a first deposition head 102 of a deposition tool) a quantum dot solution 103 onto a supporting substrate 101 in a drop-wise manner to form two or more discrete droplets on a surface of the substrate 101, the quantum dot solution 103 and discrete droplets comprising a plurality of quantum dots having primary ligands attached thereto to stabilise the quantum dots in solution. After the one or more discrete droplets of quantum dot solution 103 have been deposited, a ligand-exchange solution 105 is then deposited (e.g. via a second deposition head 104 of the deposition tool) onto the discrete droplets (before or after the solvent of the quantum dot solution 103 has evaporated, depending on the particular solutions 103, 105) in a drop-wise manner to cause replacement of the primary ligands attached to the plurality of quantum dots with shorter-chain secondary ligands. As mentioned previously, replacement of the primary ligands with the secondary ligands allows the plurality of quantum dots within each discrete droplet to become sufficiently close packed to facilitate charge transfer there between.

After ligand replacement has occurred, a rinse solution 107 may optionally be deposited onto the two or more droplets (before or after the solvent of the ligand-exchange solution 105 has evaporated, depending on the particular solutions 105, 107) to remove the primary ligands and any excess secondary ligands from the substrate 101. Removal of the primary ligands from the substrate 101 helps to prevent their reattachment to the quantum dots. As shown in FIG. 1, the rinse solution 107 may be deposited via a third deposition head 106 of the deposition tool in a drop-wise manner similar to the quantum dot 103 and ligand-exchange 105 solutions. Alternatively, the rinse solution 107 could be deposited globally by washing the substrate surface with the rinse solution 107. Once the rinse solution 107 has been removed from the substrate 101 (together with the primary and any excess secondary ligands), the substrate surface comprises two or more discrete quantum dot regions 108 each comprising a plurality of quantum dots which are separated from one another by secondary ligands. These secondary ligands have a chain length which is sufficiently short (e.g. no more than 0.1 nm, 0.25 nm, 0.5 nm, 0.75 nm, 1 nm or 1.25 nm) to enable charge transfer between the plurality of quantum dots within the quantum dot region 108.

As mentioned above, certain applications require quantum dots layers with a thickness of over 100 nm (e.g. at least 1 μm, 10 μm or 100 μm). This can achieved with the present method simply by allowing the two or more discrete droplets to dry after deposition of the various solutions 103, 105, 107, and repeating the deposition and drying steps until the resulting quantum dot regions 108 have a predetermined thickness. Since ligand replacement is performed on each individual droplet of quantum dot solution 103, it is possible to build up thicker layers of close-packed quantum dots than is currently possible.

Furthermore, by depositing discrete droplets of quantum dot 103, ligand-exchange 105 and rinse 107 solutions in a drop-wise manner (e.g. drops of no more than 1 ml, 1 μl, 1 pl or 1 fl in volume) the solvents within these solutions 103, 105, 107 are able to evaporate relatively quickly. This feature enables the use of solutions 103, 105, 107 having boiling points of over 100° C. without long waiting times between each step in situations where it is desirable to evaporate the solvent before the subsequent deposition. In practice, a number of different solvents can be used to form the quantum dot 103, ligand-exchange 105 and rinse 107 solutions. Nevertheless, the particular solvent used in the quantum dot solution 103 will typically depend on the materials used to form the quantum dots and primary ligands, and the particular solvents used in the ligand-exchange 105 and rinse 107 solutions will typically depend on the materials used to form the primary and secondary ligands. The type of deposition tool used to deposit the various solutions 103, 105, 107 may also affect the choice of solvent. As one particular example, the quantum dot solution 103 may comprise PbS quantum dots having oleic acid primary ligands within a toluene solvent, the ligand-exchange solution 105 may comprise 1,2-ethanedithiol secondary ligands within an acetonitrile solvent, and the rinse solution 107 may comprise one or more of toluene and acetonitrile.

The quantum dots, primary ligands and secondary ligands are not limited (respectively) to PbS, oleic acid and 1,2-ethanedithiol. The quantum dots may be formed from one or more of CdSe, CdS, PbSe, PbS, ZnO, ZnS, CZTS, $Cu_2S$, $Bi_2S_3$, $Ag_2S$, HgTe, CdSe, CdHgTe, InAs, InSb, Ge and CIS. Similarly, other examples of relatively long-chain primary ligands include oleate, trioctylphosphine oxide, alkylphosphonic acid, fatty acid or long-chain alkylamine; and other examples of relatively short-chain secondary ligands include ethylene diamine, ethanethiol, propanethiol, 1,3-benzenedithiol, hydrazine, formic acid, oxalic acid, acetic acid, pyridine, butylamine, $SnS_4$, $PbBr_2$, $PbI_2$ and $PbCl_2$.

In some cases, it may be desirable to evaporate the rinse solution 107 after deposition to aid removal of the primary and excess secondary ligands from the substrate 101. A number of different techniques can be used to facilitate evaporation of the rinse solution 107, such as controlling one or more of the temperature of the substrate 101, the surface chemistry of the substrate 101, and the composition of the rinse solution 107. These techniques can be used to manipulate the Marangoni flows within the drying droplets to change the drying behaviour of the droplets. Under certain conditions, there may be fluid flow towards the edges of the droplet which drives increased evaporation at the droplet edges. Under different conditions, the evaporation may occur more uniformly over the entire surface of the droplet.

As illustrated in FIG. 1, the deposition tool used to perform the method comprises first 102, second 104 and possibly third 106 deposition heads, each having a respective cartridge which may or may not form part of the deposition head 102, 104, 106 itself. The deposition heads 102, 104, 106 are configured to deposit the respective solution 103, 105, 107 from their respective cartridge in a drop-wise manner, each deposition head comprising a nozzle 110 from which the respective solution 103, 105, 107 is ejected (although in other embodiments, the respective cartridges may each have a respective exit therefrom but share a common ejection nozzle 110). In the example shown in FIG. 1, the first 102, second 104 and third 106 deposition heads are configured to be moved independently of one another. This arrangement provides flexibility in the time interval between depositions.

Figure 2:
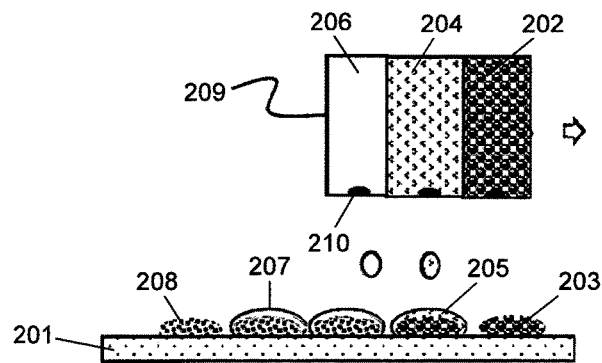
FIG. 2 illustrates schematically one example of a deposition tool for use in a method described herein.

FIG. 2 shows another example of a deposition tool for use in the method described herein. In this example, the first 202, second 204 and third 206 deposition heads form constituent parts of a combined deposition head 209 so as to be configured to be moved together. Furthermore, the deposition tool can be configured such that the distance moved by the combined deposition head 209 between subsequent depositions is substantially the same as the distance between the nozzles of the constituent parts 202, 204, 206. This feature helps to ensure that the ligand-exchange 205 and rinse 207 solutions are deposited onto each droplet of quantum drop solution 203. The arrangement of FIG. 2 reduces the overall deposition time since all the printheads are co-located allowing for a single-pass deposition. In some scenarios, the constituent parts 202, 204, 206 of the combined deposition head 209 may have independent control over the volume of the drops deposited and independent control over the timings of the depositions and the deposition of QDs, ligand replacement and rinse solutions may be done in a single printing pass or in multiple printing passes.

In both configurations of deposition tool, there may be a plurality of first 202, second 204 and/or third 206 deposition heads together with their respective cartridges. The use of multiple heads 202, 204, 206 for each solution 203, 205, 207 reduces the total deposition time further, as each head 202, 204, 206 may be configured to deposit its solution 203, 205, 207 on different regions of the substrate 201. In some cases, the deposition tool may even comprise a separate first 202, second 204 and/or third 206 deposition head for each quantum dot region 208, thus allowing completion of the process in a matter of seconds. This may be used to conveniently form an array of discreet droplets/quantum dot regions. Furthermore, two or more of each type of deposition head 202, 204, 206 may be configured to share a common cartridge (instead of having their own individual cartridges) to reduce the cost and complexity of the deposition tool.

The deposition tool may utilise a number of different dispensing technologies in order to deposit the various solutions 203, 205, 207. Suitable examples include inkjet (continuous or drop on demand), electrospray, aerosol jet (e.g. Optomec jet 5x) and valve-jet technologies.

In order to demonstrate the present method, a sample was prepared by inkjet printing a 10 mg/l quantum dot solution comprising PbS quantum dots stabilised by oleic acid (primary ligands) in toluene using a Fuji Dimatix™ 4800 materials deposition system. This deposition tool allows 1 picoliter drops to be deposited with a placement accuracy of ~50 μm. The quantum dot solution was deposited onto a graphene coated silicon substrate 301 to form a plurality of droplets using different numbers of ejected drops to vary the thickness of the droplets. In particular, two rows of six droplets 311 were formed with 11 drops per droplet, two rows of six droplets 312 were formed with 6 drops per droplet, and two rows of six droplets 313 were formed with 4 drops per droplet.

Figure 3A:
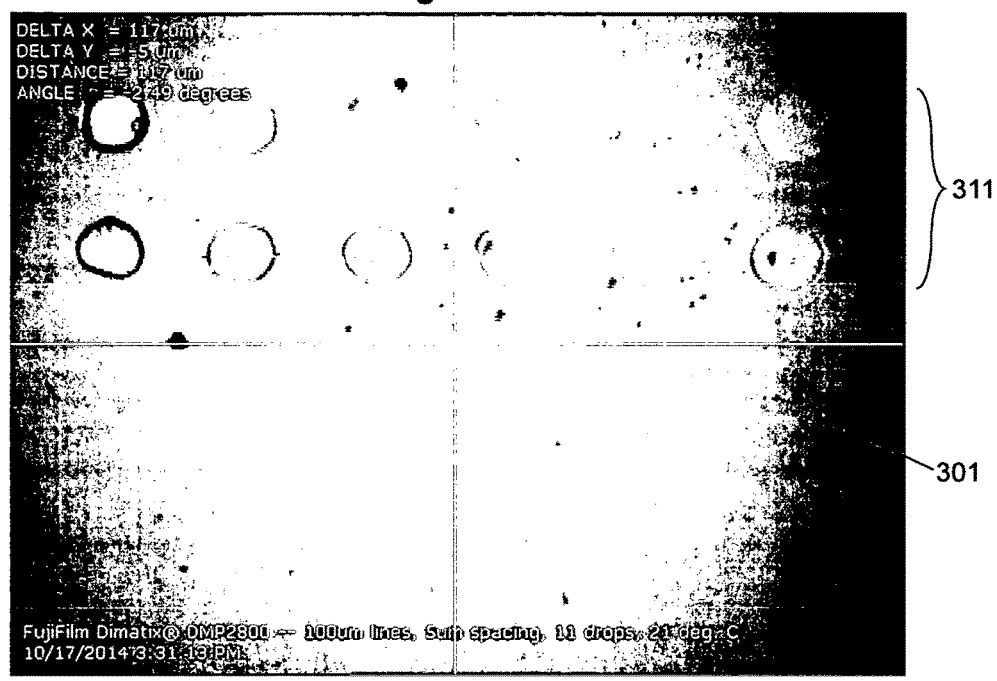
FIG. 3a is an optical micrograph of a substrate comprising two rows of droplets formed from 11 drops of quantum dot solution.
Figure 3B:
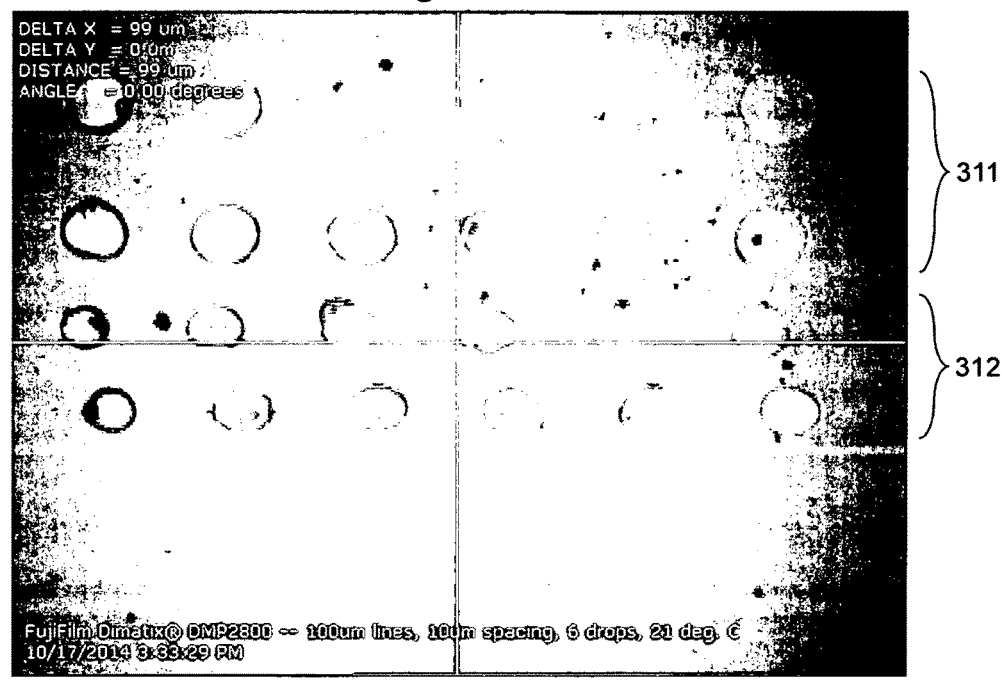
FIG. 3b is an optical micrograph of the substrate of FIG. 3a further comprising two rows of droplets formed from 6 drops of quantum dot solution.
Figure 3C:
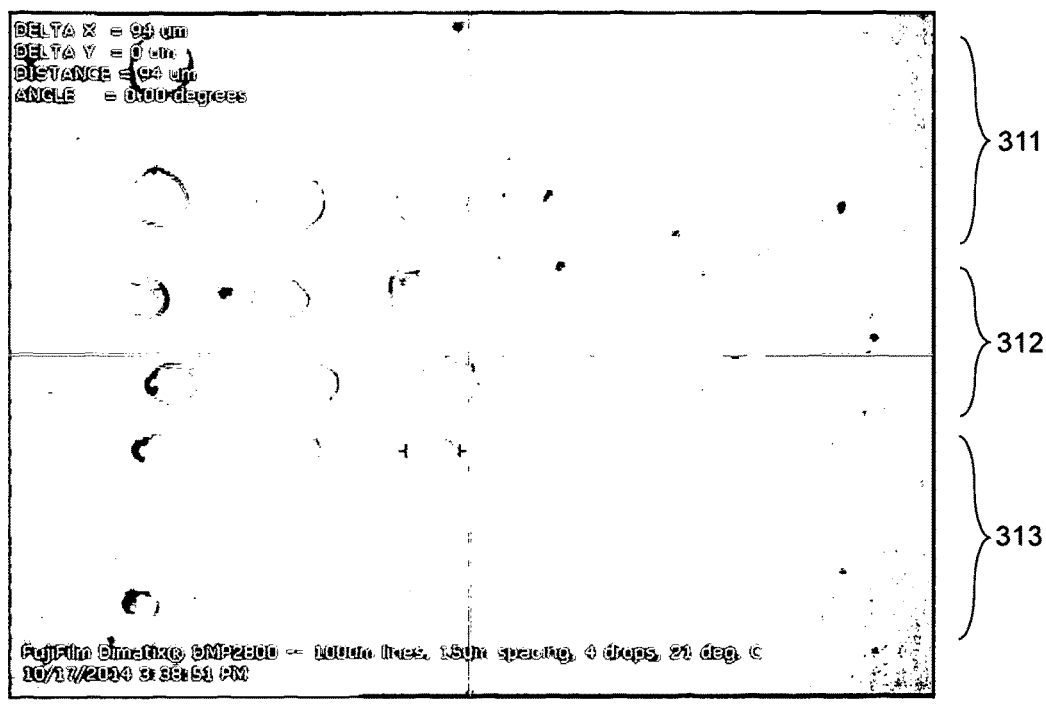
FIG. 3c is an optical micrograph of the substrate of FIG. 3b further comprising two rows of droplets formed from 4 drops of quantum dot solution.

FIGS. 3a-3c are optical micrographs of the substrate after depositing the 11, 6 and 4-drop droplets, respectively. After formation of the droplets of quantum dot solution, a ligand-exchange solution comprising 2% ethanedithiol (secondary ligands) in acetonitrile was deposited onto one row of each size of droplet (rows 1, 3 and 6 in the micrographs) to replace the oleic acid with ethanedithiol.

Figure 3D:
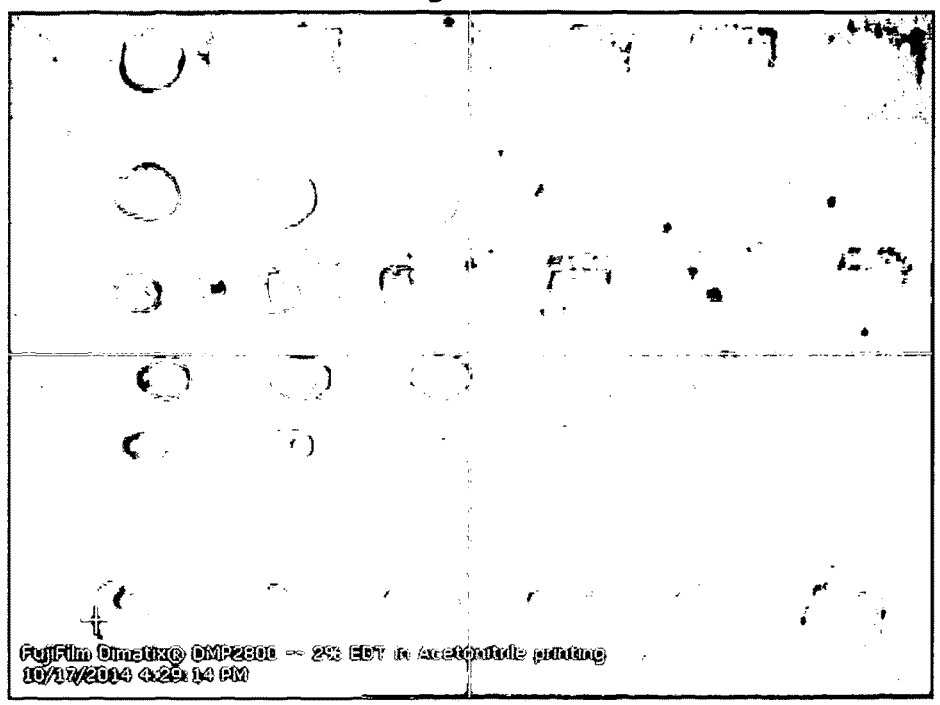
FIG. 3d is an optical micrograph of the substrate of FIG. 3c following deposition of a ligand-exchange solution onto three rows of droplets.

FIG. 3d is an optical micrograph of the substrate after deposition of the ligand-exchange solution. After ligand replacement, a first rinse solution comprising acetonitrile was deposited onto the droplets to remove the oleic acid and any excess ethanedithiol.

Figure 3E:
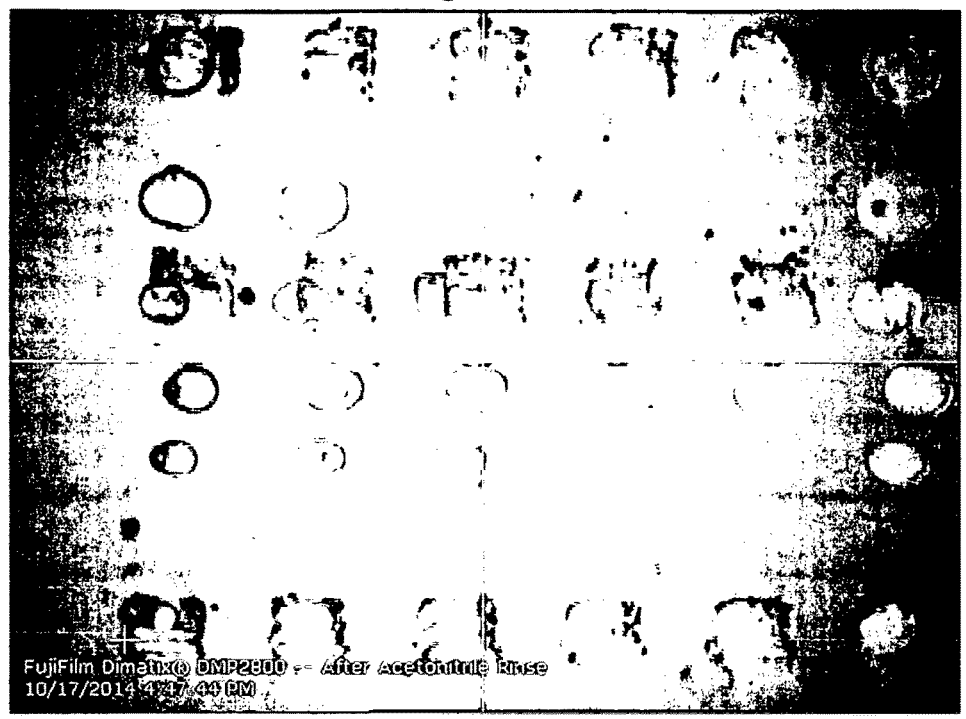
FIG. 3e is an optical micrograph of the substrate of FIG. 3d following deposition of a first rinse solution.

FIG. 3e is an optical micrograph of the substrate of FIG. 3d following deposition of the first rinse solution. A second rinse solution comprising toluene was then deposited onto the droplets to help ensure removal of the oleic acid and any excess ethanedithiol.

Figure 3F:
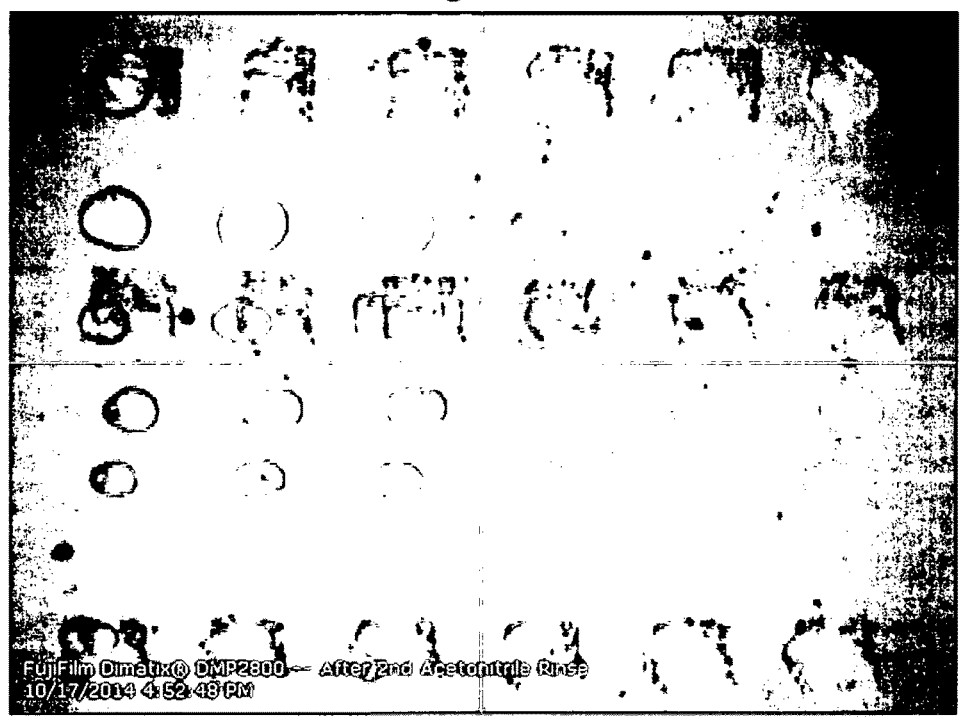
FIG. 3f is an optical micrograph of the substrate of FIG. 3e following deposition of a second rinse solution.

FIG. 3f is an optical micrograph of the substrate of FIG. 3e following deposition of the second rinse solution.

Figure 4A:
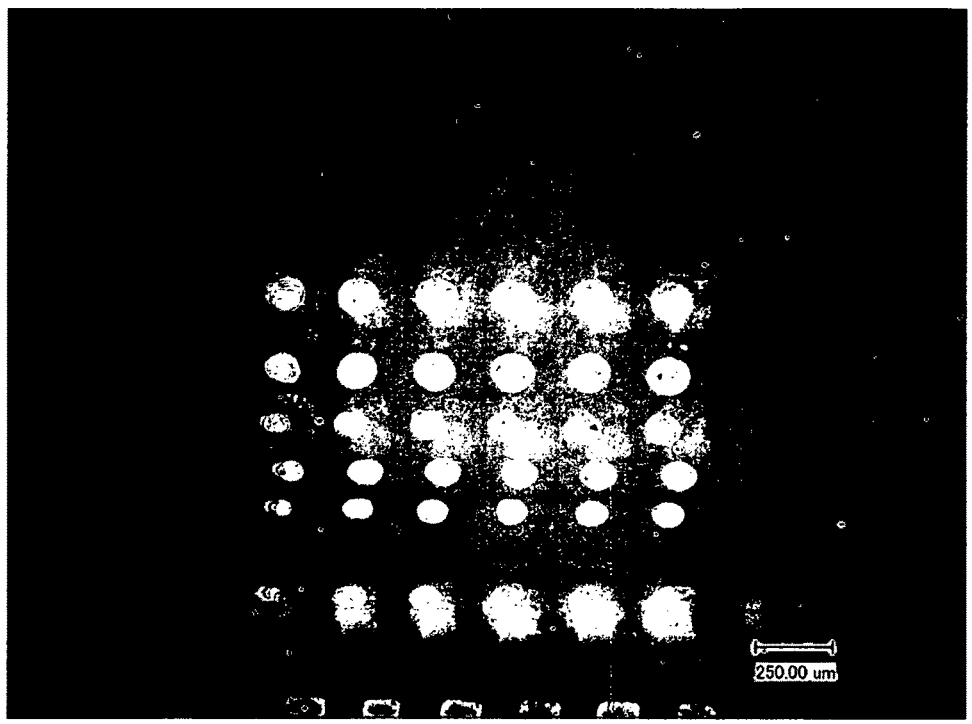
FIG. 4a is an optical micrograph of the substrate of FIG. 3f at a low level of magnification.
Figure 4B:
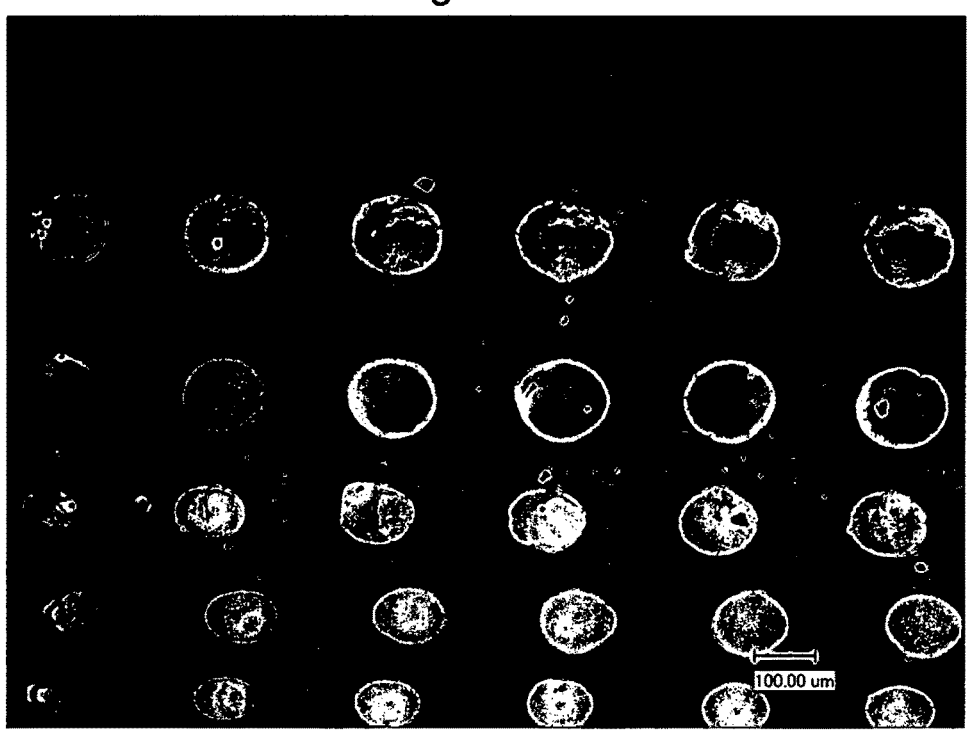
FIG. 4b is an optical micrograph of the substrate of FIG. 3f at a medium level of magnification.
Figure 4C:
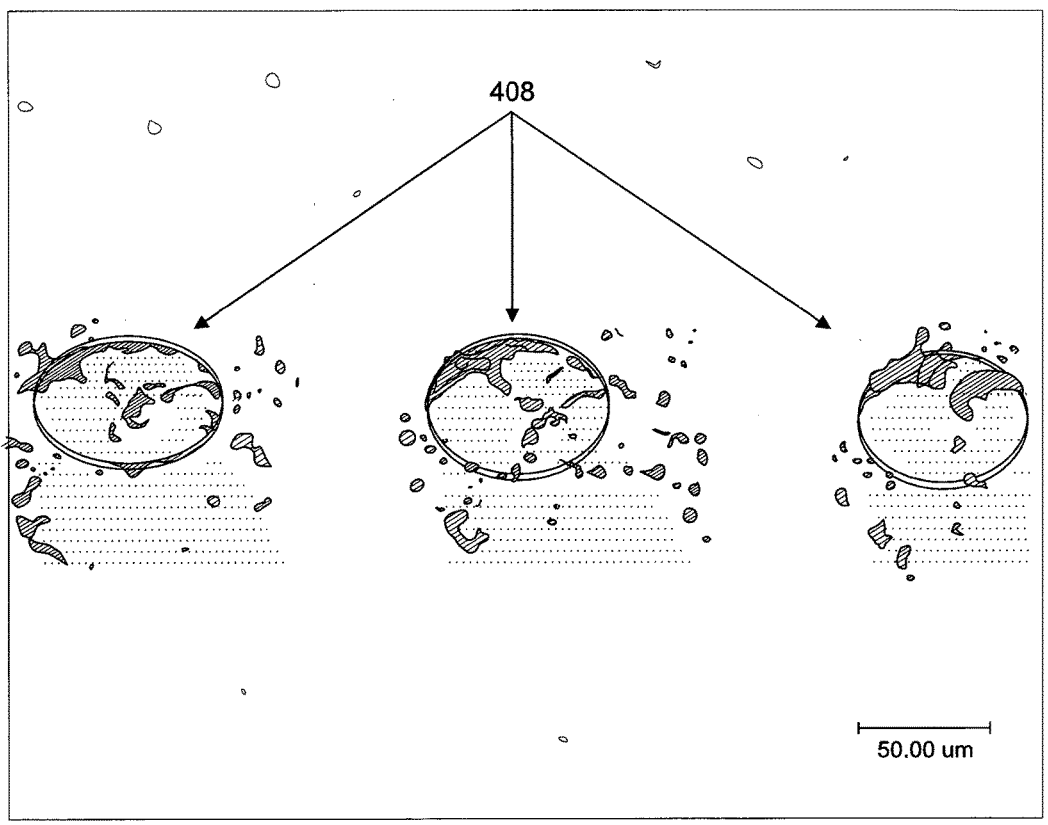
FIG. 4c is an optical micrograph of the substrate of FIG. 3f at a high level of magnification.

FIGS. 4a-4c show optical micrographs of the substrate of FIG. 3f taken at low, medium and high levels of magnification, respectively. The three quantum dot regions 408 (droplets) visible in FIG. 4c have been subjected to the ligand replacement process. An atomic force microscope (AFM) was then used to determine the thickness of the quantum dot regions 408 for comparison of regions which were exposed to the ligand-exchange solution with those which were not exposed to the ligand-exchange solution.

Figure 5A:
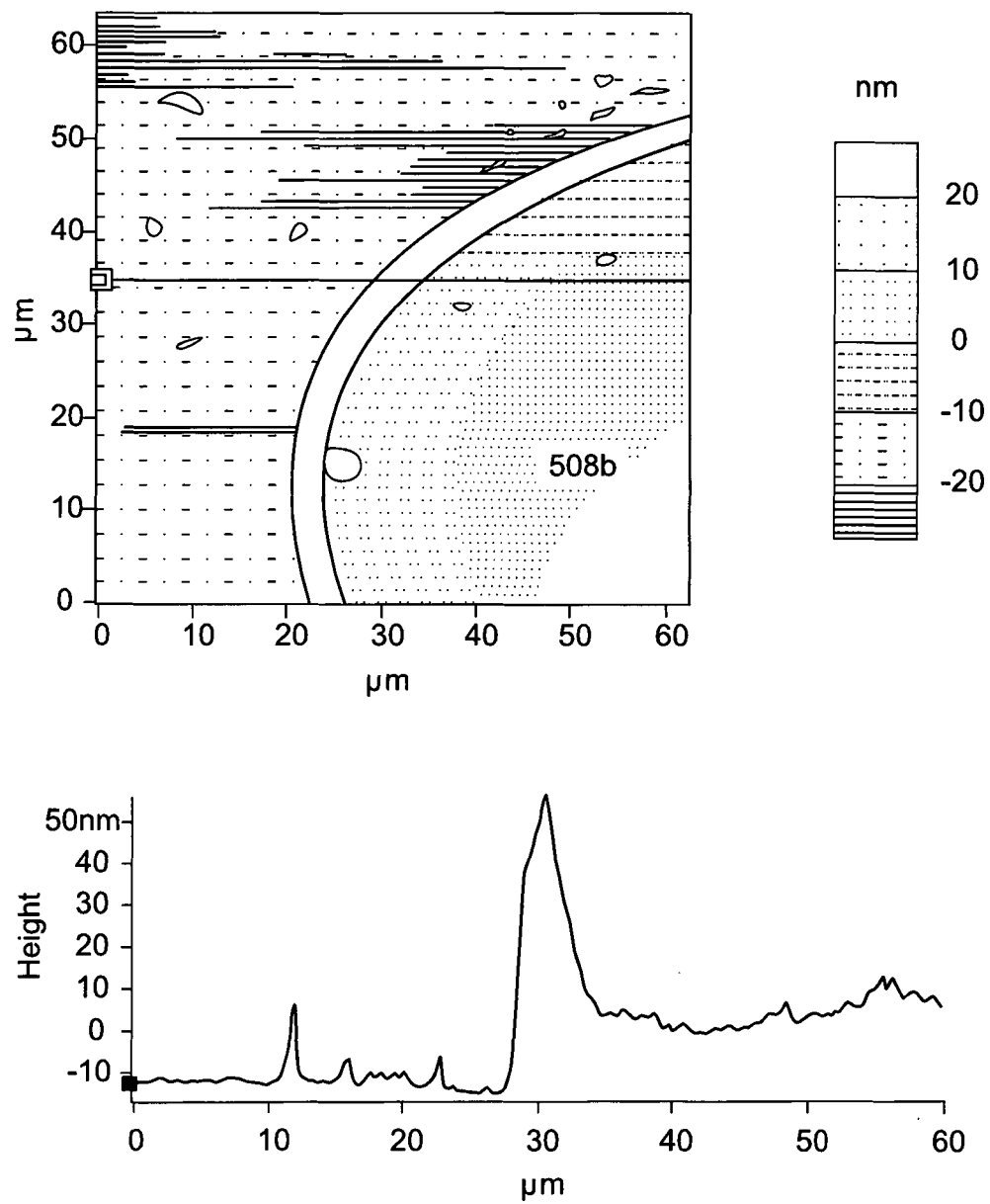
FIG. 5a is an AFM image and corresponding height profile of a quantum dot region of FIG. 4a with no ligand replacement.
Figure 5B:
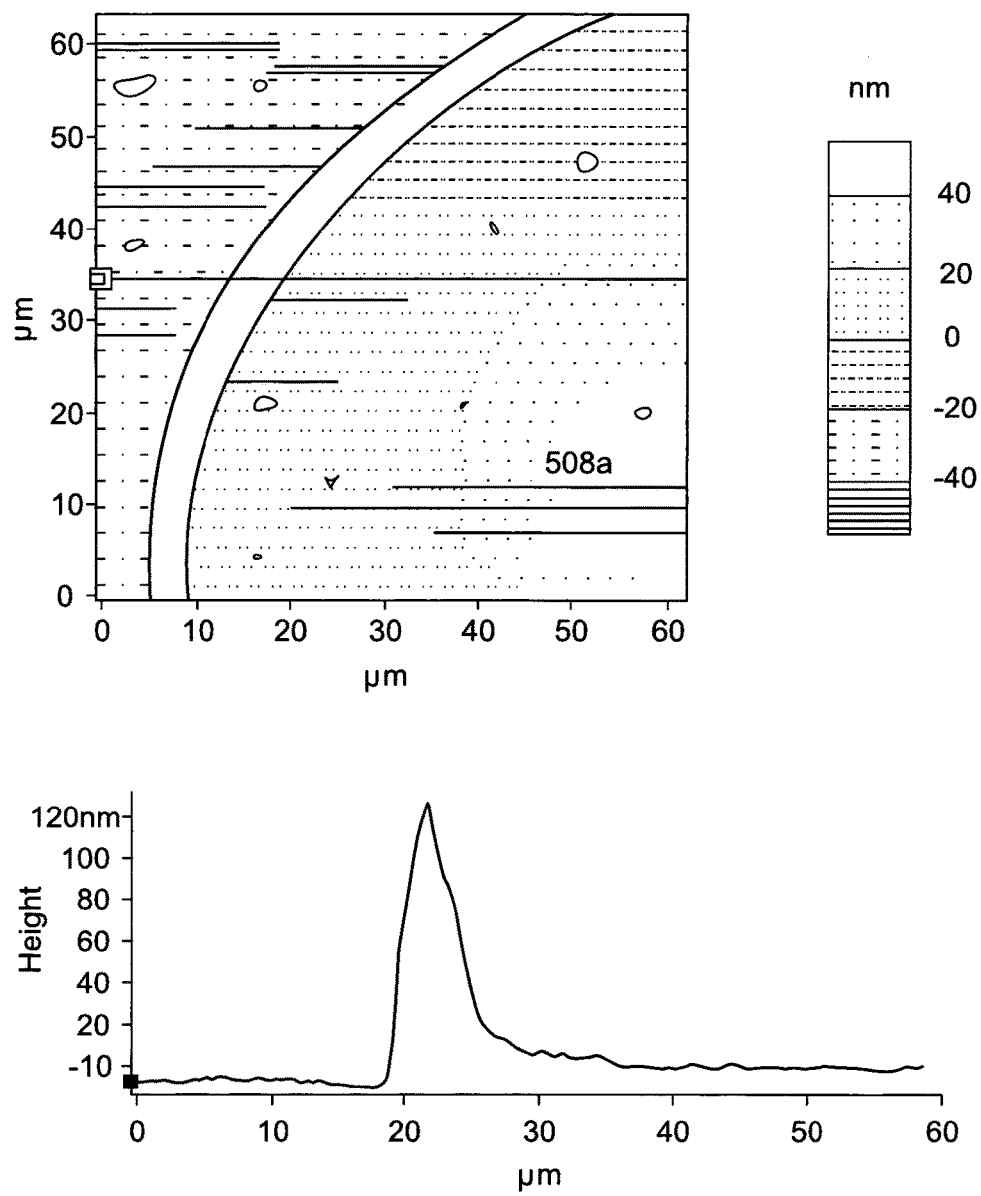
FIG. 5b is an AFM image and corresponding height profile of a quantum dot region of FIG. 4a after ligand replacement.

FIGS. 5a and 5b show an AFM image and corresponding height profile for a quantum dot region 508b with no ligand replacement and a quantum dot region 508a after ligand replacement, respectively. The quantum dot regions 508a,b can be seen at the right hand side of each image and were found to have a similar thickness of 10-20 nm. Conductive AFM measurements were then obtained for the quantum dot regions 508a,b of FIGS. 5a and 5b using an Asylum MP3D in contact mode with a set point voltage of 0.2V, a silicon ASYELEC-01 Ir relex/tip coated conductive cantilever and an applied tip voltage of 6V.

Figure 6A:
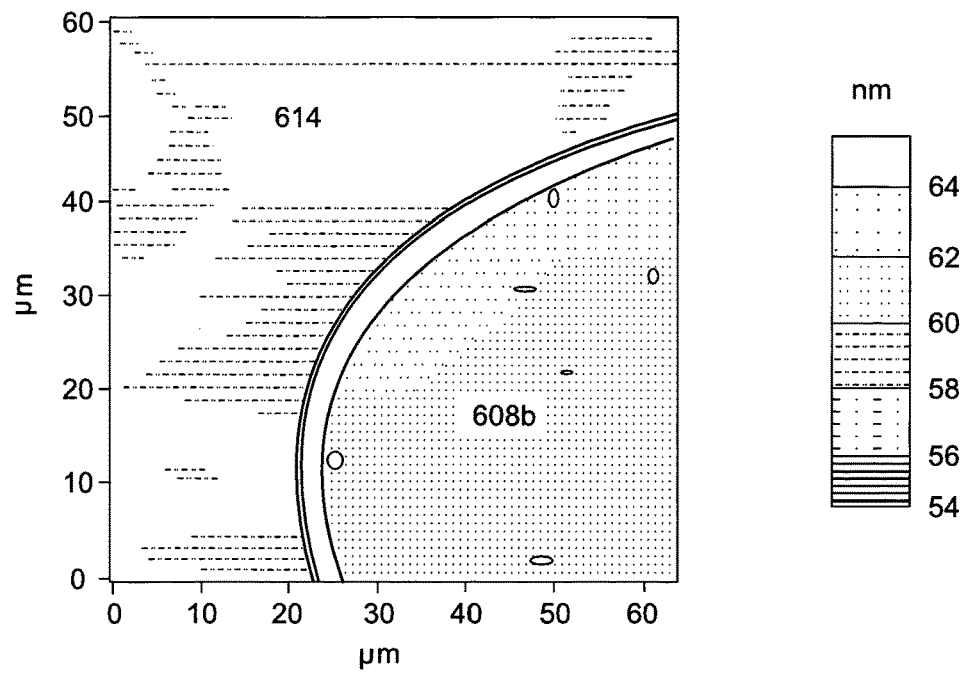
Figure 6B:
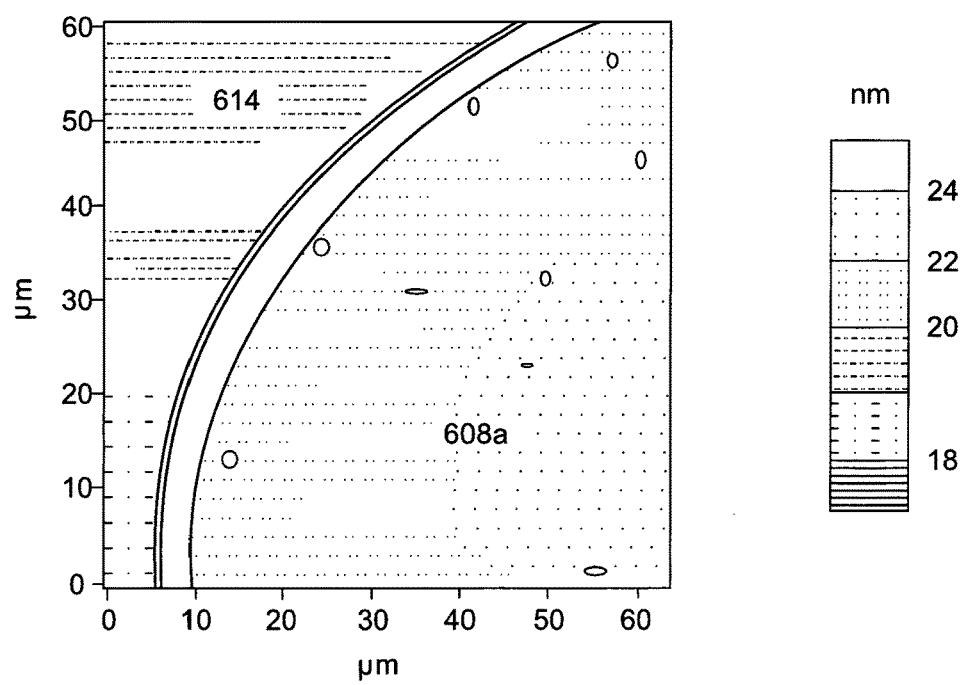
FIG. 6b is a conductive AFM image of the quantum dot region of FIG. 5b.

FIGS. 6a and 6b show a conductive AFM image for the quantum dot region 608b with no ligand replacement and the quantum dot region 608a after ligand replacement, respectively. In both cases, there was found to be measured current flow through the underlying graphene layer 614 (to the left of the quantum dot region 608a,b in both images) of approximately 10 nA, but only the ligand-replaced region 608a showed any conductivity through the quantum dots within the region 608a.

Figure 7:
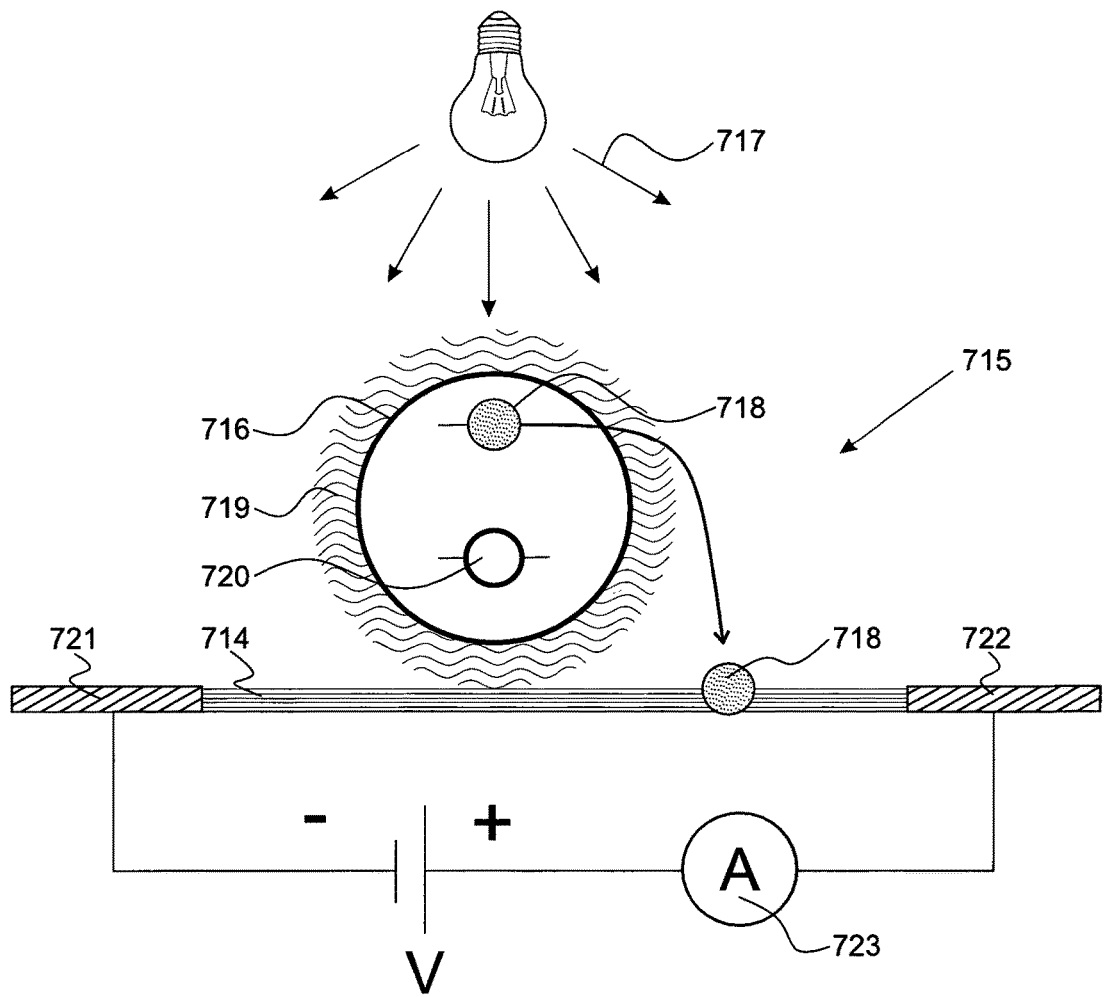
FIG. 7 illustrates schematically one example of a quantum dot apparatus configured to detect incident electromagnetic radiation.

FIG. 7 illustrates schematically one example of an apparatus 715 which can be formed using the method described herein. The apparatus 715 comprises a plurality of quantum dots 716 (although only one is shown here for ease of visualisation) on top of a layer of electrically conductive material 714, the quantum dots configured such that electromagnetic radiation 717 incident thereon causes excitation of electrons 718 within the quantum dots 716 resulting in the generation of photo-excited charge 718. The incident electromagnetic radiation 717 may comprise one or more of radio waves, microwaves, infrared, visible light, ultraviolet, x-rays, gamma rays and thermal radiation depending on the dimensions of the quantum dots. In addition, the layer of electrically conductive material 714 may be the supporting substrate onto which the quantum dots 716 are deposited, or it may be a separate charge collection layer on top of a supporting substrate. The supporting substrate may comprise one or more of Si, GaAs, BN, $SiO_2$, LiF, $Al_2O_3$, $HfO_2$ diamond like carbon and graphene; and the electrically conductive material 714 may comprise one or more of carbon, graphene, reduced graphene oxide, carbon nanotubes, a metal and a semiconductor.

The quantum dots 716 comprise the secondary ligands 719 attached thereto. Since the secondary ligands 719 have a relatively short chain length (e.g. ≤1 nm) the photo-excited charge 718, generated from the quantum dots 716 by the incident electromagnetic radiation 717, is transferred to the underlying layer 714 to leave photo-excited charge 720 of opposite polarity on the quantum dots 716. The photo-excited charge 720 of opposite polarity generates an electric field causing a change in an electrical property (e.g. conductivity, conductance, resistivity or resistance) of the underlying layer 714 which can be used to detect one or more of the presence and magnitude of the incident electromagnetic radiation 717.

In order to enable the electrical property of the underlying layer 714 to be determined, the apparatus 715 also comprises source 721 and drain 722 electrodes configured to cause a flow of charge from the source electrode 721 through the layer of electrically conductive material 714 to the drain electrode 722. The change in electrical property may be determined using a voltmeter or ammeter 723, for example.

In this example, the quantum dots 716 are configured such that the generated photo-excited charge 718 comprises the electrons excited by the incident electromagnetic radiation 717, and the photo-excited charge 720 of opposite polarity comprises electron-holes left by the excited electrons. Furthermore, the secondary ligands 719 are configured such that the transfer of photo-excited charge 718 comprises tunnelling of the electrons excited by the incident electromagnetic radiation 717 through the secondary ligands 719 to the layer of electrically conductive material 714.

In other examples, quantum dots 716 may be configured such that the photo-excited charge 720 of opposite polarity comprises the electrons excited by the incident electromagnetic radiation 717, and the generated photo-excited charge 718 comprises the electron-holes left by the excited electrons. In this scenario, the secondary ligands 719 may be configured such that the transfer of photo-excited charge 718 comprises tunnelling of the electron-holes through the secondary ligands 719 to the layer of electrically conductive material 714.

The charge transfer mechanism is not limited solely to electron/hole tunnelling, however. In some examples, electron thermally-activated electron/hole hopping may be used. Transfer of the photo-excited charge 718 is not only governed by the secondary ligands 719, but also by the band structure between the quantum dots 716 and the underlying layer of material 714. This may be affected by doping or bias voltages, which could be used to tune the optoelectrical response of the apparatus.

As mentioned above, the quantum dot solution used to transport the quantum dots to the supporting substrate comprises a plurality of quantum dots having primary ligands attached thereto to stabilise the quantum dots in solution. In some examples, the quantum dot solution may further comprise an electrically conductive material such that the quantum dots and electrically conductive material are arranged within the quantum dot solution to form a composite material. In this scenario, the electrically conductive material may facilitate charge transfer between the quantum dots and from the quantum dots to the underlying layer of electrically conductive material.

Also, although the absorption wavelength of quantum dots can be tuned by controlling their size, their selectivity/sensitivity can be further controlled by depositing a functional material onto the quantum dots to functionalise them for a particular application. For example, a photosensitive semiconducting material such as a conjugated polymer, dye or metal nanoparticles may be used to respond to a particular wavelength of light. The selectivity/sensitivity of the quantum dots may also be modified by functionalising them with biomaterials such as antibodies, antigens, proteins or DNA fragments. In some cases, these biomaterials may be used to interact specifically with other biological molecules to alter the selectivity/sensitivity to light.

For most applications, the discrete quantum dot regions on the substrate will be configured to form an optically sensitive surface. In order to improve the chances of detecting incident electromagnetic radiation, the quantum dot solution should be deposited to maximise the areal coverage of the quantum dots. In this respect, the quantum dot solution may be deposited such that the two or more discrete droplets (which will typically have a diameter of less than or equal to 10 μm, 25 μm, 50 μm or 100 μm) are deposited to form a one, two or three dimensional array and are spaced apart by no more than 5 μm, 10 μm or 15 μm. This can be achieved by controlling the position, or drop firing frequency of the deposition head or underlying substrate together with the volume of each drop leaving the deposition head. A number of different deposition techniques can be used to form such an array. Suitable examples include conventional inkjet printing (to produce a drop size of ≤1 μl), inkjet deposition (e.g. using drop-on-demand, thermal or piezo heads to produce a drop size of ≤1 μl), continuous inkjet using controlled droplet breakup to select printing or non-printing (e.g. via thermal pulse, piezo pulse or electrostatic force to produce a drop size of ≤1 μl), electrospray (aka electrostatic drop generation or electrohydrodynamic to produce a drop size of ≤1 pl), and valve-jet (to produce a drop size of ≤1 ml).

Figure 8:
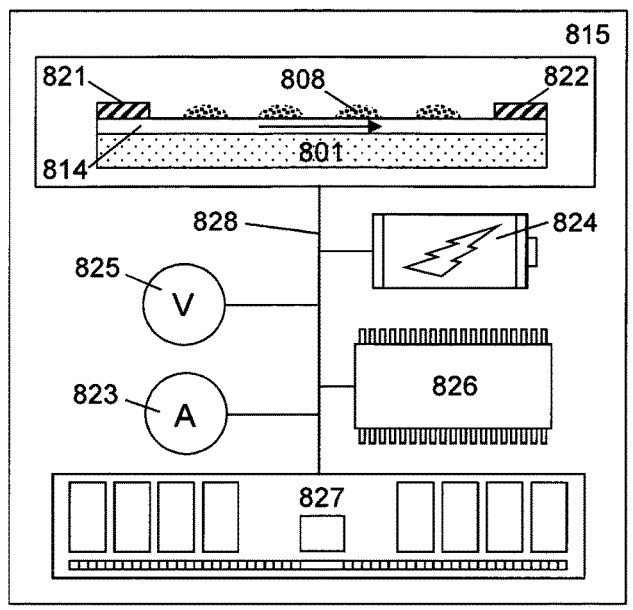
FIG. 8 illustrates schematically another example of a quantum dot apparatus.

FIG. 8 illustrates schematically an apparatus 815 according to another embodiment of the present disclosure. The apparatus 815 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a camera, an image sensor, a photodetector, a phototransistor, and a module for one or more of the same. In the example shown, the apparatus 815 comprises two or more discrete quantum dot regions 808 and an electrically conductive material 814 on the surface of a supporting substrate 801, first 821 and second 822 electrodes, a power source 824, an ammeter 823, a voltmeter 825, a processor 826 and a storage medium 827, which are electrically connected to one another by a data bus 828.

The power source 824 is configured to apply a voltage between the source and drain electrodes, the voltmeter 825 is configured to measure the applied voltage, and the ammeter 823 is configured to measure the resulting current flowing through the electrically conductive material.

The processor 826 is configured for general operation of the apparatus 815 by providing signalling to, and receiving signalling from, the other components to manage their operation. In addition, the processor 826 is configured to receive the voltage and current measurements from the voltmeter 825 and ammeter 823, respectively, determine an electrical property of the electrically conductive material using the voltage and current measurements, and determine one or more of the presence and magnitude of incident electromagnetic radiation based on the determined electrical property.

The storage medium 827 is configured to store computer code configured to perform, control or enable operation of the apparatus 815. The storage medium 827 may also be configured to store settings for the other components. The processor 826 may access the storage medium 827 to retrieve the component settings in order to manage the operation of the other components. The storage medium 827 may also be configured to store calibration data (e.g. predetermined measurements of intensity levels of incident electromagnetic radiation versus a corresponding electrical property) for use by the processor 826 in determining one or more of the presence and magnitude of the incident electromagnetic radiation.

The processor 826 may be a microprocessor, including an Application Specific Integrated Circuit (ASIC). The storage medium 827 may be a temporary storage medium such as a volatile random access memory. On the other hand, the storage medium 827 may be a permanent storage medium such as a hard disk drive, a flash memory, or a non-volatile random access memory.

Figure 9:
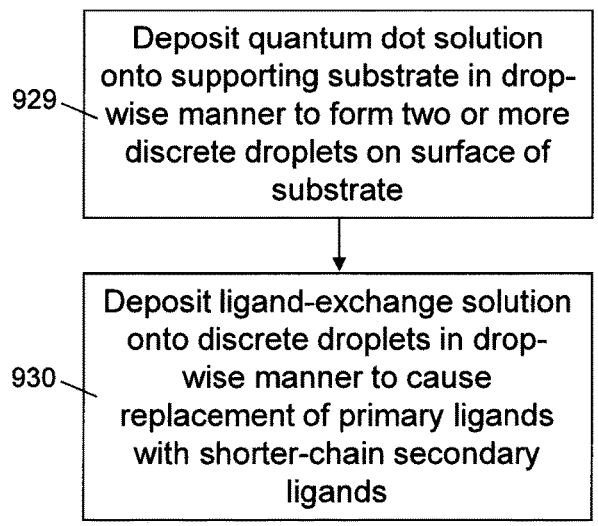
FIG. 9 illustrates schematically the main steps of a method described herein.

FIG. 9 illustrates schematically the main steps 929-930 of the method described herein. As shown, the method generally comprises: depositing a quantum dot solution onto a supporting substrate in a drop-wise manner to form two or more discrete droplets on the surface of the substrate 929; and depositing a ligand-exchange solution onto the discrete droplets in a drop-wise manner to cause replacement of the primary ligands with shorter-chain secondary ligands 930.

Figure 10:
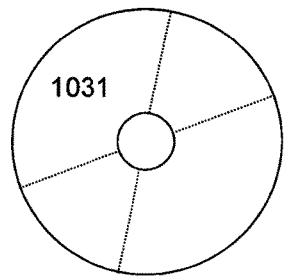
FIG. 10 illustrates schematically a computer-readable medium comprising a computer program configured to perform, control or enable one or more steps of a method described herein.

FIG. 10 illustrates schematically a computer/processor readable medium 1031 providing a computer program according to one embodiment. In this example, the computer/processor readable medium 1031 is a disc such as a digital versatile disc (DVD) or a compact disc (CD). In other embodiments, the computer/processor readable medium 1031 may be any medium that has been programmed in such a way as to carry out an inventive function. The computer/processor readable medium 1031 may be a removable memory device such as a memory stick or memory card (SD, mini SD, micro SD or nano SD).

The computer program may comprise computer code configured to perform, control or enable one or more of the method steps 929-930 of FIG. 9, e.g. by controlling the deposition tool used to deposit the quantum dot and ligand-exchange solutions. Additionally or alternatively, the computer program may be configured to measure/determine the difference in the electrical property (e.g. conductivity, conductance, resistance, resistivity, etc) of the electrically conductive material 714, 814 of the apparatus 715, 815 of FIG. 7 or 8, and determine one or more of the presence and magnitude of the incident electromagnetic radiation 717.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A method, comprising:
depositing a quantum dot solution onto a supporting substrate in a drop-wise manner to form one or more discrete droplets on a surface of the substrate, the quantum dot solution and discrete droplets comprising a plurality of quantum dots having primary ligands attached thereto to stabilise the quantum dots in solution; and
depositing a ligand-exchange solution onto the one or more discrete droplets in a drop-wise manner to cause replacement of the primary ligands attached to the plurality of quantum dots with shorter-chain secondary ligands, replacement of the primary ligands with the secondary ligands allowing the plurality of quantum dots within each discrete droplet to become sufficiently close packed to facilitate charge transfer therebetween.

2. The method of claim 1, wherein the method comprises depositing a rinse solution onto the one or more droplets in a drop-wise manner to remove the primary ligands and any excess secondary ligands from the substrate.

3. The method of claim 2, wherein the method comprises evaporating the rinse solution after deposition to aid removal of the primary and excess secondary ligands from the substrate.

4. The method of claim 3, wherein the method comprises controlling one or more of the temperature of the substrate, the surface chemistry of the substrate, and the composition of the rinse solution to facilitate evaporation of the rinse solution.

5. The method of claim 1, wherein the method comprises:
allowing the one or more discrete droplets to dry after deposition of the quantum dot and ligand-exchange solutions to form two or more corresponding quantum dot regions on the surface of the substrate; and
repeating the deposition and drying steps until the two or more quantum dot regions have a predetermined thickness.

6. The method of claim 1, wherein the quantum dot solution and discrete droplets further comprise an electrically conductive material, the quantum dots and electrically conductive material arranged within the quantum dot solution and discrete droplets to form a composite material.

7. The method of claim 1, wherein the method comprises depositing a functional material onto the one or more discrete droplets to one or more of functionalise the plurality of quantum dots within the droplets for a particular application and encapsulate the quantum dots to provide environmental stability.

8. The method of claim 1, wherein the quantum dot solution is deposited to form a one, two or three dimensional array of discrete droplets on the surface of the substrate.

9. A computer program embodied on a non-transitory computer-readable medium, said computer program comprising computer code configured to control a processor to perform the method of claim 1.

* * * * *